(12) United States Patent
Daugherty et al.

(10) Patent No.: US 6,344,105 B1
(45) Date of Patent: Feb. 5, 2002

(54) TECHNIQUES FOR IMPROVING ETCH RATE UNIFORMITY

(75) Inventors: John E. Daugherty, Oakland; Neil Benjamin, Palo Alto; Jeff Bogart, Los Gatos; Vahid Vahedi, Albany; David Cooperberg, Fremont; Alan Miller, Moraga, all of CA (US); Yoko Yamaguchi, Yokohama (JP)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/345,639

(22) Filed: Jun. 30, 1999

(51) Int. Cl.⁷ .............................................. H01L 21/00
(52) U.S. Cl. ..................................................... 156/345
(58) Field of Search ..................... 156/345; 118/723 E; 204/298.34

(56) References Cited

U.S. PATENT DOCUMENTS

| | | | |
|---|---|---|---|
| 5,271,788 A | * 12/1993 | Hasegawa et al. | 156/345 |
| 5,411,624 A | * 5/1995 | Hirano et al. | 156/345 |
| 5,529,657 A | * 6/1996 | Ishii | 156/345 |
| 5,556,500 A | * 9/1996 | Hasegawa et al. | 156/345 |
| 5,660,673 A | 8/1997 | Miyoshi | |
| 5,716,486 A | 2/1998 | Selwyn et al. | |
| 5,904,799 A | 5/1999 | Donohoe | |
| 6,074,488 A | 6/2000 | Roderick et al. | |
| 6,096,161 A | * 8/2000 | Kim et al. | 156/345 |
| 6,117,349 A | * 9/2000 | Huang et al. | 156/345 |

FOREIGN PATENT DOCUMENTS

| | | |
|---|---|---|
| EP | 0 660 499 A1 | 6/1995 |
| EP | 0 786 804 A2 | 7/1997 |
| WO | WO 99/14788 | 3/1999 |
| WO | WO 99/14796 | 3/1999 |

OTHER PUBLICATIONS

Surendra et al., "Across Wafer Etch Rate Uniformity in a High Density Plasma Reactor: Experiment and Modeling", Appl. Phys. Lett. 66, May 1, 1995.

* cited by examiner

Primary Examiner—Thi Dang
(74) Attorney, Agent, or Firm—Bayer Weaver & Thomas, LLP

(57) ABSTRACT

Improved methods and apparatus for ion-assisted etch processing in a plasma processing system are disclosed. In accordance with various aspects of the invention, an elevated edge ring, a grooved edge ring, and a RF coupled edge ring are disclosed. The invention operates to improve etch rate uniformity across a substrate (wafer). Etch rate uniformity improvement provided by the invention not only improves fabrication yields but also is cost efficient and does not risk particulate and/or heavy metal contamination.

29 Claims, 6 Drawing Sheets

TECHNIQUES FOR IMPROVING ETCH RATE UNIFORMITY

BACKGROUND OF THE INVENTION

1. Field of the Invention

The present invention relates to fabrication of semiconductor integrated circuits and, more particularly, to improved methods and apparatus for ion-assisted etch processing in a plasma processing system.

2. Description of the Related Art

In the fabrication of semiconductor-based devices, e.g., integrated circuits or flat panel displays, layers of materials may alternately be deposited onto and etched from a substrate surface. As is well known in the art, the etching of the deposited layers may be accomplished by a variety of techniques, including plasma-enhanced etching. In plasma-enhanced etching, the actual etching typically takes place inside a plasma processing chamber of a plasma processing system. To form the desired pattern on the substrate surface, an appropriate mask (e.g., a photoresist mask) is typically provided. A plasma is then formed from a suitable etchant source gas, or mixture of gases, and used to etch areas that are unprotected by the mask, thereby leaving behind the desired pattern.

To facilitate discussion, FIG. 1A depicts a simplified plasma processing apparatus 100 suitable for fabrication of semiconductor-based devices. The simplified plasma processing apparatus 100 includes a wafer processing chamber 102 having an electrostatic chuck (ESC) 104. The chuck 104 acts as an electrode and supports a wafer 106 (i.e., substrate) during fabrication. An edge ring 108 borders the edge of the chuck 104. In the case of etch processes, a number of parameters within the wafer processing chamber 102 are tightly controlled to maintain high tolerance etch results. Process parameters governing etch results may include gas composition, plasma excitation, plasma distribution over the wafer 106, etc. Since the etch tolerance (and resulting semiconductor-based device performance) is highly sensitive to such process parameters, accurate control thereof is required.

The surface of the wafer 106 is etched by an appropriate etchant source gas that is released into the wafer processing chamber 102. The etchant source gas can be released through a showerhead 110. The etchant source gas may also be released by other mechanisms such as via a gas ring disposed inside the chamber or via ports built into the walls of the wafer processing chamber 102. During ion-assisted etch processes, Radio Frequency (RF) power supplied to showerhead 110 ignites the etchant source gas, thereby forming a plasma cloud ("plasma") above wafer 106 during etch processes. It should be noted that other means of plasma excitation may also be used. For example, the application of microwave energy, the use of inductive coils, the introduction of a wave excited by an antenna, or capacitive coupling to the showerhead 110 can also be used to excite the plasma. In ion-assisted etch processes, chuck 104 is typically RF powered using a RF power supply (not shown).

In an ion-assisted etch process, the local etch rate is dominated by ion concentration. Ion-assisted etch processes are typically used to perform oxide etches or polysilicon etches. In other words, ion driven/assisted etch processes generally refer to etching processes wherein the etching is predominately facilitated by the physical reaction of the accelerated plasma ions ("ions") with the wafer (substrate). Ion-assisted etching applications include, for example, sputtering, Reactive Ion Etching (RIE), chemical sputtering, chemically assisted physical sputtering, and physically assisted chemical sputtering.

With ion-assisted etching, application of RF power to the chuck 104 (as well as the showerhead 110) results in the formation of an electric field and in turn a sheath 112 above the wafer 106. The electric field associated with the sheath 112 promotes the acceleration of ions toward the top surface of the wafer 106. Ideally, the accelerated ions collide at an angle that is substantially perpendicular (i.e., substantially normal or about 90 degrees) with the respect to the surface of the wafer 106 during etch processes. The accelerated ions that collide with the wafer 106 operate to "physically" etch the wafer 106.

The edge ring 108 is an insulator material that is electrically floating (i.e., not RF powered). Edge ring 108 is used to shield the edge of the chuck 104 from ion bombardment such as during etch processes. Edge ring 108 can also help focus the ion bombardment with respect to the wafer 106. As shown in FIG. 1A, the chuck 104 can be surrounded by an inner surface 114 of the edge ring 108. The inner surface 114 is also within the outer edge of the wafer 106.

An outer surface 116 of the edge ring 108 extends beyond the outer edge of the wafer 106. An upper portion of the inner surface 114 of the edge ring 114 is adjacent to not only the chuck 104 but also the wafer 106. Conventionally, a top surface 118 of the edge ring 108 is below or about the same level as a top surface of the wafer 106.

One major problem associated with ion-assisted etch processes using a convention plasma processing apparatus is that the etch rate is not uniform across the wafer 106. More specifically, etch rate at locations near the edges of the wafer is significantly higher than the etch rate for points near the center of the wafer. FIG. 1B illustrates a cross-section of the wafer 106 following etch processes where the etched depth is greater at a perimeter portion 120 of the wafer 106 than at a middle portion 122 of the wafer 106.

The non-uniform etch rate is attributed primarily to the non-uniform thickness of the sheath 112 above the surface of wafer 106. As depicted in FIG. 1A, the thickness (or the plasma density at the sheath boundary) of the sheath 112 at the middle portion 120 of the wafer 106 is significantly thicker than the thickness (density) of the sheath 112 at the perimeter portion 11 6 of the wafer 106. That is, in the vicinity of the electronically floating region above the edge ring 108 the sheath "curves" near the perimeter of the wafer 106. The sheath curvature around the perimeter of the wafer 106 causes relatively more ions to collide near the perimeter of the wafer 106 during ion-assisted etch processes. A higher collision rate near the perimeter results in relatively higher etch rates near the perimeter of the wafer (see FIG. 1B).

An additional problem is caused by the sheath curvature. In particular, the sheath curvature near the perimeter of the wafer 106 induces the ions to collide at angles that are not substantially perpendicular (i.e., not substantially normal or about 90 degrees) with respect to the surface of the wafer 106. In ion-assisted etch processes, ion collisions at such non-perpendicular angles also contribute to higher etch rates. Furthermore, the non-perpendicular angles of ion collision near the edges can have an undesired "tilting" effect on the etched features (e.g., trenches, vias or lines) on the wafer 106. Tilting generally refers to an undesired effect during etching whereby one or more sides of a feature are not substantially perpendicular with the surface of a wafer. Here, at the perimeter of the wafer 106, the "tilting" effect produces an asymmetric feature. Features are intended to be symmetric, so asymmetric features are undesired and can cause severe problems that render a fabricated integrated circuit essentially defective.

One potential solution to address some of the problems associated with non-uniformity of etch rates in ion-assisted etching processes is to enlarge the chuck so that it extends beyond the edges of wafer. Enlarging the chuck would effectively shift the sheath curvature beyond the edges of the wafer. This may be a feasible solution for purely chemical etching applications. However, this solution would not be feasible for ion-assisted etch processes since the extended portion of the chuck would also be exposed to ions and the etching process. Exposing the chuck can cause particulate and/or heavy metal contamination during the ion-assisted etch processes. The extended portions of the chuck would also be exposed to significantly higher etch rates to compound the problems associated with contamination. Further, the high etch rates at the exposed portions of the chuck can rapidly deteriorate the chuck which can lead to often replacement of the entire chuck which is an expensive part to be a consumable.

To curtail some of the problems associated with etch rate non-uniformity associated with ion-assisted etch processes, it may be possible to alter the distribution of plasma above the wafer. For example, a conventional "focus ring" can be placed above the sheath. By attempting to focus the plasma on the wafer, it is believed that a traditional focus ring may reduce the ion density (plasma) distributed over the edges of a wafer. If successful, the reduction of plasma distribution could result in lowering the etch rates near the perimeter of the wafer (i.e., the number of ions that collide near the edges would be reduced). Using an external element such as a focus ring may marginally compensate for the sheath curvature effect. However, introduction of an another element to the ionized etching -process can raise new problems associated with contamination and/or costly consumable parts. In addition, use of a traditional focus ring may not even be feasible for some ionized etching applications.

In the view of the foregoing, there is a need for improved methods and apparatus for improving etch rate uniformity in ion-assisted processes.

SUMMARY OF THE INVENTION

Broadly speaking, the invention relates to improved methods and apparatus for ion-assisted etch processing in a plasma processing system. The invention operates to improve etch rate uniformity across a substrate (wafer). The invention can be implemented in numerous ways, including as a device, an apparatus and a method. Several embodiments of the invention are discussed below.

An improved plasma processing apparatus according to one embodiment of a first aspect of the invention is disclosed. The improved plasma processing apparatus includes a wafer processing chamber having an electrostatic chuck (ESC) and an elevated edge ring. The chuck acts as an electrode and supports a wafer (i.e., substrate) during fabrication. In accordance to one embodiment of the aspect of the invention, the elevated edge ring that borders the edge of the chuck and extends upward beyond the top surface of the wafer.

An improved plasma processing apparatus according to one embodiment of a second aspect of the invention is disclosed. Here, the plasma processing apparatus uses a grooved edge ring. The grooved edge ring includes a grooved area that essentially surrounds the area near the edge of the wafer as well as an area below the bottom surface of the wafer.

An improved plasma processing apparatus according to one embodiment of a third aspect of the invention is disclosed. The improved plasma processing apparatus includes a wafer processing chamber having a radio frequency (RF) powered and a RF coupled edge ring. The RF coupled edge ring is placed over a portion of the RF powered chuck and adjacent to an edge of the substrate, and a portion of RF energy provided by the RF powered chuck is coupled to the inner RF coupled edge ring.

The invention has numerous advantages. One advantage of the invention is that etch rate uniformity across a substrate surface is significantly improved. Another advantage of the invention is that significant improvement in etch rate uniformity is achieved without risking contamination of the processing chamber. Yet another advantage is that tilting of etched features can be substantially eliminated.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF THE INVENTION

The invention pertains to improved methods and apparatus for ion-assisted etch processing in a plasma processing system. The invention operates to improve etch rate uniformity across a substrate (wafer). Etch rate uniformity improvement provided by the invention not only improves fabrication yields but also is cost efficient and does not risk particulate and/or heavy metal contamination.

Embodiments of several aspects of the invention are discussed below with reference to FIGS. 2–6. However, those skilled in the art will readily appreciate that the detailed description given herein with respect to these figures is for explanatory purposes as the invention extends beyond these limited embodiments.

Figure 2:
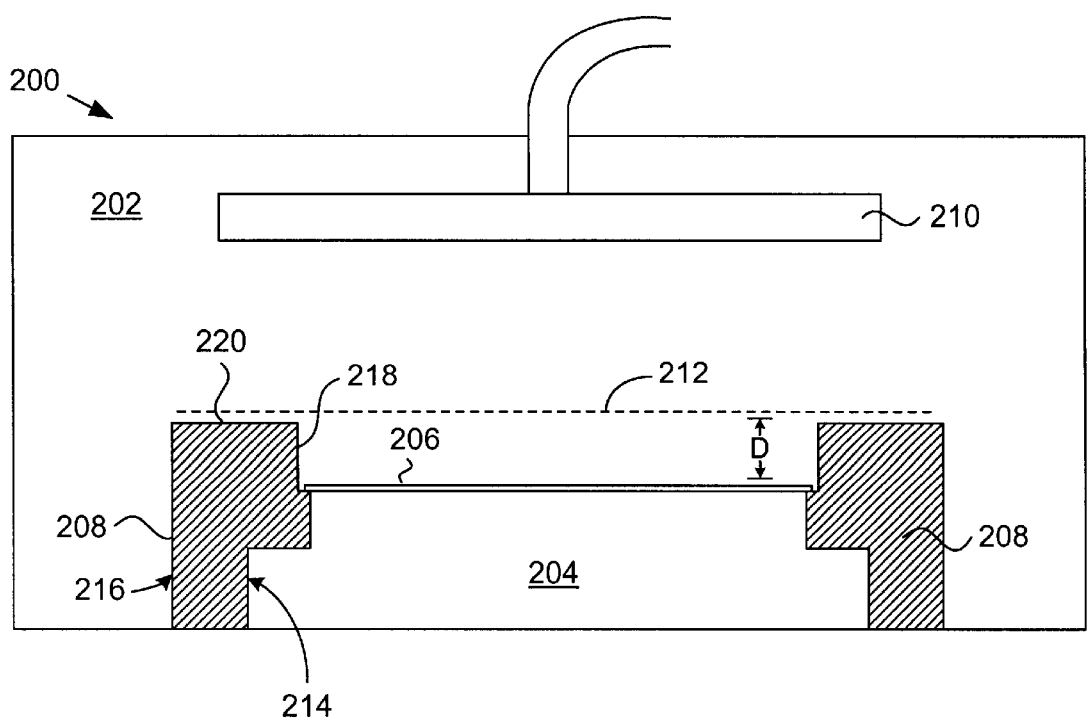
FIG. 2 illustrates a plasma processing apparatus including an elevated edge ring accordance to one embodiment of a first aspect of the invention.

FIG. 2 illustrates a plasma processing apparatus 200 according to one embodiment of a first aspect of the invention. The plasma processing apparatus 200 includes a wafer processing chamber 202 having an electrostatic chuck (ESC) 204. The chuck 204 acts as an electrode and supports a wafer 206 (i.e., substrate) during fabrication. An elevated edge ring 208 borders the edge of the chuck 204 and extends upward beyond the top surface of the wafer 206.

The elevated edge ring 208 is typically an insulator material that is electrically floating (i.e., not RF powered). Elevated edge ring 108 is used to shield the edge of the chuck 106 from ion bombardment such as during etch processes. As shown in FIG. 2, the chuck 204 is surrounded by an inner surface 214 of the edge ring 208. The inner surface 214 is also within the outer edge of the wafer 206.

An outer surface 216 of the edge ring 208 extends beyond the outer edge of the wafer 206. An upper portion of the inner surface 214 of the elevated edge ring 208 includes a recessed area 218. The wafer 206 sits in the recessed area 218 and covers a portion of the upper portion of the inner surface 114. A top surface 220 of the elevated edge ring 208 is above a top surface of the wafer 206 by a predetermined distance D. The predetermined distance D varies depending on implementation and particular processes being performed. Typically, the predetermined distance D is on the order of 1 to 10 millimeters. In the case of etch processes, a number of parameters within the wafer processing chamber 202 are tightly controlled to maintain high tolerance etch results. Process parameters governing etch results may include gas composition, plasma excitation, plasma distribution over the wafer 206, etc. Since the etch tolerance (and resulting semiconductor-based device performance) is highly sensitive to such process parameters, accurate control thereof is required.

The surface of the wafer 206 is etched by an appropriate etchant source gas that released into the wafer processing chamber 202. The etchant source gas can be released through a showerhead 210. The etchant source gas may also be released by other mechanisms such as via a gas ring disposed inside the wafer processing chamber 202 or via ports built into the walls of the wafer processing chamber 202. During ion-assisted etch processes, Radio Frequency (RF) power supplied to showerhead 210 ignites the etchant source gas, thereby forming a plasma cloud ("plasma") above wafer 206 during etch processes. In ion-assisted etch processes, chuck 204 is typically RF powered using a RF power supply (not shown).

In an ion-assisted etch process, the local etch rate is dominated by ion concentration. Ion-assisted etch processes are typically used to perform oxide etches or polysilicon etches. In other words, ion driven/assisted etch processes generally refer to etching processes wherein the etching is predominately facilitated by the physical reaction of the accelerated plasma ions ("ions") with the wafer (substrate). Ion-assisted etching applications include, for example, sputtering, Reactive Ion Etching (RIE), chemical sputtering, chemically assisted physical sputtering, and physically assisted chemical sputtering.

Figure 1A:
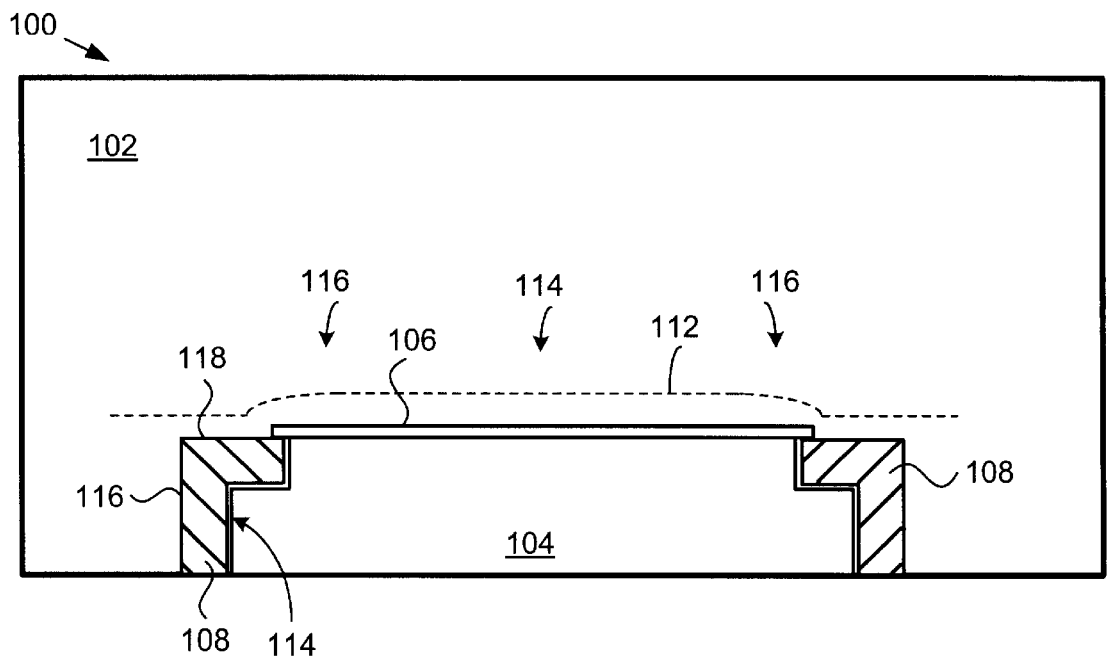
FIG. 1A depicts a simplified plasma processing apparatus 100 suitable for fabrication of semiconductor-based devices.
Figure 1B:
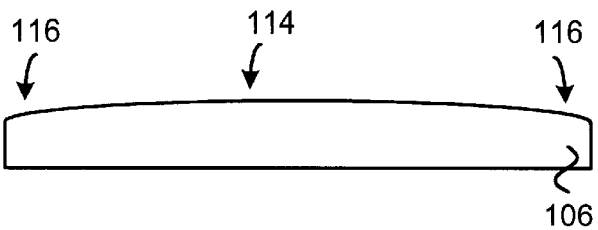
FIG. 1B illustrates a cross-section of a wafer following etch processes where the etched depth is greater at a perimeter portion of the wafer than at a middle portion of the wafer.

With ion-assisted etching, application of RF power to the chuck 206 (as well as the showerhead 210) results in the formation of an electric field and in turn a sheath 212 above the wafer 106. The electric field associated with the sheath 212 promotes the acceleration of ions toward the top surface of the wafer 106. The elevated edge ring 208 extends upward beyond the top surface of the wafer 206 as previous noted. By extending above the top surface of the wafer 206, the elevated edge ring 208 performs a corrective action on the sheath 212. Specifically, in one embodiment, the thickness (or density) of the sheath 212 near the perimeter of the wafer 206 becomes substantially the same thickness (density) as the middle portion of the wafer 206. Note that the resulting sheath 212 can be made essentially uniform across the wafer 206 using the elevated edge ring 208. Hence, in comparison to the sheath 112 of FIG. 1A, the sheath 212 is significantly improved. As a result, of the uniform thickness (density) of the sheath 212, the collision rate of ions with the surface of the wafer 206 is substantially more uniform across the entire surface of the wafer 206 than obtained by conventional approaches. Furthermore, the angle at which the ions collide with the surface of the wafer 206 is substantially normal not only at inner regions but also peripheral regions of the wafer 206. Consequently, the etch rate across the entire surface of the wafer 206 is substantially more uniform than conventionally achieved and etched features at the peripheral regions do not suffer from "tilting" problems.

Figure 3:
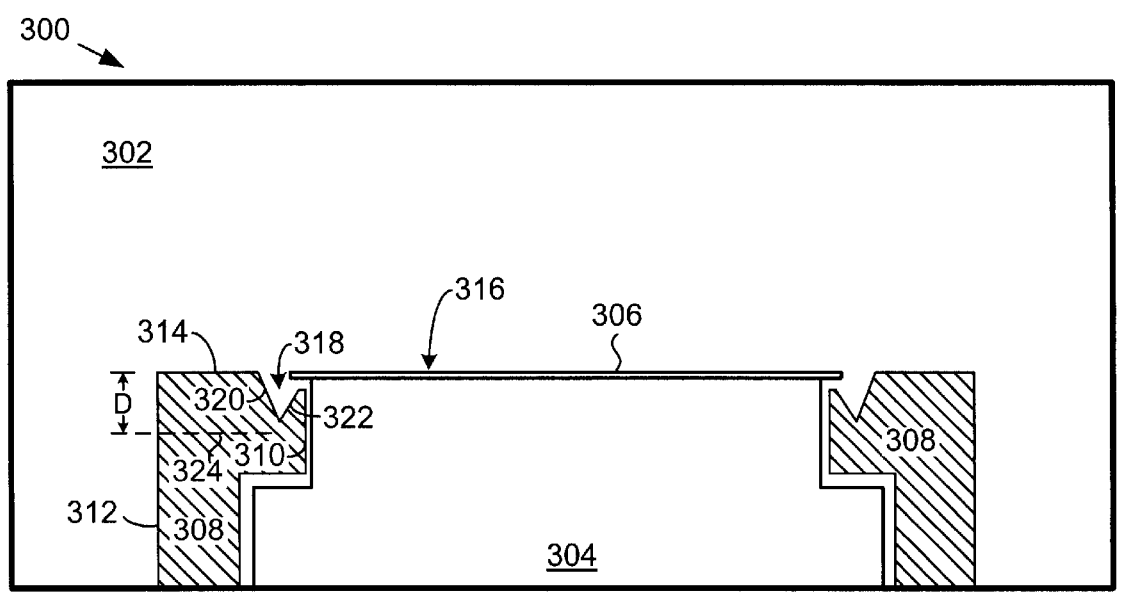
FIG. 3 illustrates a plasma processing apparatus 300 including a grooved edge ring in accordance to one embodiment of a second aspect of the invention.

FIG. 3 illustrates a plasma processing apparatus 300 according to one embodiment of a second aspect of the invention. The plasma processing apparatus 300 includes a wafer processing chamber 302 having an electrostatic chuck (ESC) 304. The chuck 304 acts as an electrode and supports a wafer 306 (i.e., substrate) during fabrication. A grooved edge ring 308 borders the edge of the chuck 304.

The grooved edge ring 308 is typically an insulator material that is electrically floating (i.e., not RF powered). Grooved edge ring 308 is used to shield the edge of the chuck 304 from ion bombardment such as during etch processes. As shown in FIG. 3, the chuck 304 is surrounded by an inner surface 310 of the edge ring 308. The inner surface 310 is also within the outer edge of the wafer 306. An outer surface 312 of the grooved edge ring 308 extends beyond the outer edge of the wafer 306. In one embodiment, an upper surface 314 of the grooved edge ring 308 is substantially about the same level as an upper surface 316 of the wafer 306. However, an upper surface of the grooved edge ring 308 adjacent the edge of the wafer 306 has a grooved area 318. As shown in FIG. 3, the grooved area 318 is defined by a first sloping portion 320, a second sloping portion 322, and a bottom notch 324 connecting the first and second sloping portions 320 and 322. The sloping surface 320 connects the upper surface 314 to the partially covered area 322.

As discussed earlier, application of RF power to the chuck 306 results in the formation of an electric field and in turn a sheath above the wafer 306. The electric field associated with the sheath promotes the acceleration of ions toward the top surface of the wafer 106. The grooved edge ring 308 provides the grooved area 318 that is essentially under the edge of the wafer 306. As illustrated in FIG. 3, the grooved area 318 can also further extend further below the bottom surface of the wafer 306 at the edge of the wafer 306. In an alternative embodiment, the grooved area could extend only down to about the bottom surface of the wafer 306.

By providing a grooved area, the grooved edge ring 308 performs a corrective action on the sheath above the wafer 306. Specifically, in one embodiment, the thickness (or density) of the sheath near the perimeter (edges) of the wafer becomes substantially closer to the thickness (density) of the sheath directly above the chuck 304. It is surmised that the grooved area of the grooved edge ring 308 effectively stretches out the sheath so that it flattens out over the edge of the wafer 306.

As a result of the improved uniformity of the thickness (density) of the sheath above wafer 306, the collision rate of ions with the surface of the wafer 306 is more uniform across the entire surface of the wafer 306 than obtained by conventional approaches. Furthermore, the angle at which the ions collide with the surface of the wafer 306 is more normal at the edge regions of the wafer 306 than that obtained by the plasma processing apparatus 100 of FIG. 1A. Consequently, the etch rate across the entire surface of the wafer 306 is more uniform than conventionally achieved and etched features at the peripheral regions suffer from less "tilting" problems.

Figure 4:
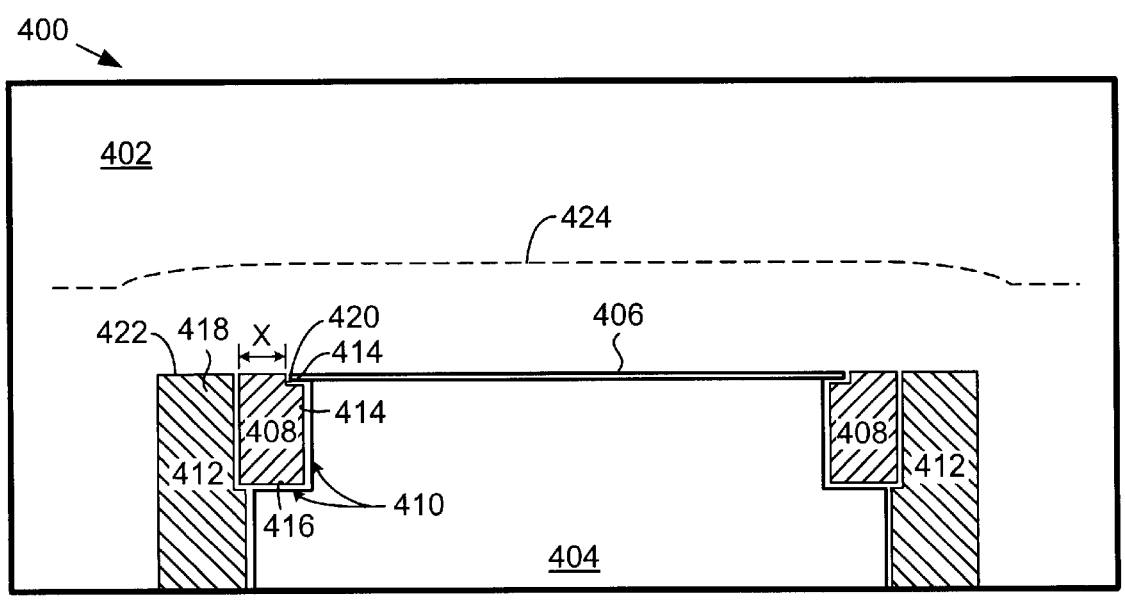
FIG. 4 illustrates a plasma processing apparatus 400 including an inner RF coupled edge ring and a outer edge ring, in accordance to one embodiment of a third aspect of the invention.

FIG. 4 illustrates a plasma processing apparatus 400 according to one embodiment of a third aspect of the invention. The plasma processing apparatus 400 includes a wafer processing chamber 402 having an electrostatic chuck (ESC) 404. The chuck 404 acts as an electrode and supports a wafer 406 (i.e., substrate) during fabrication. An inner RF coupled edge ring 408 borders a notch 410 of the chuck 404 and provides a RF coupled region the extends beyond the edges of the wafer 406. An outer edge ring 412 borders the inner RF coupled edge ring 408 and an outer edge of the chuck 404.

The inner RF coupled edge ring 408 is used to shield the notch 410 of the chuck 404 from ion bombardment such as during etch processes. As shown in FIG. 4, the notch 410 of the chuck 404 is adjacent an inner surface 414 and a bottom surface 416 of the inner RF coupled edge ring 408. The inner surface 414 is also within the outer edge of the wafer 406. An outer surface 418 of the inner RF coupled edge ring 408 extends beyond the outer edge of the wafer 406 and beyond an outer edge 420 of the chuck 404. An upper portion of the inner surface 414 of the RF coupled edge ring 408 includes a recessed area 414. The wafer 406 sits in the recessed area 414 and covers the seam between the inner surface 414 of the inner RF coupled edge ring 408 and the outer surface of the chuck 404 that is adjacent the inner RF coupled edge ring 408. A top surface 422 of the inner RF coupled edge ring 408 is substantially at the same height as a top surface of the wafer 406. The outer surface 418 of the inner RF coupled edge ring 408 is at a predetermined distance X from the edge of the wafer 406. The predetermined distance X can vary depending on implementation and particular processes being performed. Typically, 1–2 centimeters is a suitable for the predetermined distance X for most processes.

The outer edge ring 412 is used to shield the outer surface 418 of the chuck 404. The arrangement of the outer edge ring 412 and the inner RF coupled edge ring 408 also prevent any open seams to the chuck 404. The material used for the outer edge ring 412 is an insulator or dielectric material (e.g., ceramic, quartz, and polymer). In one embodiment, the material for the outer edge ring 412 does not provide any significant RF coupling from the chuck 406. Hence, the outer edge ring 412 should not be significantly consumed during etch processing. In another embodiment, a filler layer of dielectric (or insulator) material can be provided between the chuck 404 and the outer edge ring 412 so as to insure the outer edge ring 412 is not RF coupled to the chuck 406. As an example, the material for the filler layer can be chosen from a variety of appropriate materials, including ceramic, quartz, Teflon, or polymers.

Application of RF power to the chuck 406 results in the formation of an electric field and in turn a sheath 424 above the wafer 406. The electric field associated with the sheath 424 promotes the acceleration of ions toward the top surface of the wafer 406. The inner RF coupled edge ring 408 is made of material with suitable properties so that a portion of the RF energy provided to the chuck 404 is RF coupled through the inner RF coupled edge ring 408. RF coupled edge ring 408 can be made from a variety of materials that will not contaminate the plasma processing. Examples of suitable materials include semiconducting materials (e.g., Silicon Carbide) or dielectric materials, wherein the conductivity of the material can be controlled through doping and the like. The material and its conductivity of the inner RF coupled edge ring 408 are chosen depending on the degree of the RF coupling desired. Typically, RF coupling can be improved by either using a thinner, inner RF coupled edge ring 408 or increasing the conductivity of the material used as the inner RF coupled edge ring 408. Given that the inner RF coupled edge ring 408 will be etched as the wafer 406 is etched, it should not produce contaminants and should not be too expensive of a material because it will require periodic replacement. On the other hand, in one embodiment, the material for the outer edge ring 412 does not provide any significant RF coupling from the chuck 406 and thus should not require periodic replacement for the most part.

Advantageously, the RF coupled edge ring 408 provides a RF coupled region that extends beyond the edge of wafer 406 such that the resulting sheath 424 is has a substantially uniform thickness over the entire surface of the wafer 406, including over the edge of the wafer 406. By providing an extended RF coupled region, the RF coupled edge ring 408 performs a corrective action on the sheath 424 above the wafer 406. Specifically, in one embodiment, the thickness (or density) of the sheath 424 near the perimeter (edges) of the wafer becomes substantially the same as the thickness (density) of the sheath 424 directly above the chuck 406. Note that the resulting thickness (density) of the sheath 424 substantially improves uniformity of the sheath 424 across the wafer 406. Hence, in comparison to the sheath 112 of FIG. 1A, the sheath 424 above wafer 406 is substantially improved.

As a result of the uniform thickness (density) of the sheath 424 above wafer 406, the collision rate of ions with the surface of the wafer 406 is substantially more uniform across the entire surface of the wafer 406 than obtained by conventional approaches. Furthermore, the angle at which the ions collide with the surface of the wafer 406 is substantially normal not only at inner regions but also peripheral regions of the wafer 406. Consequently, the etch rate across the entire surface of the wafer 406 is more uniform than conventionally achieved and etched features at the peripheral regions do not suffer from "tilting" problems.

Figure 5:
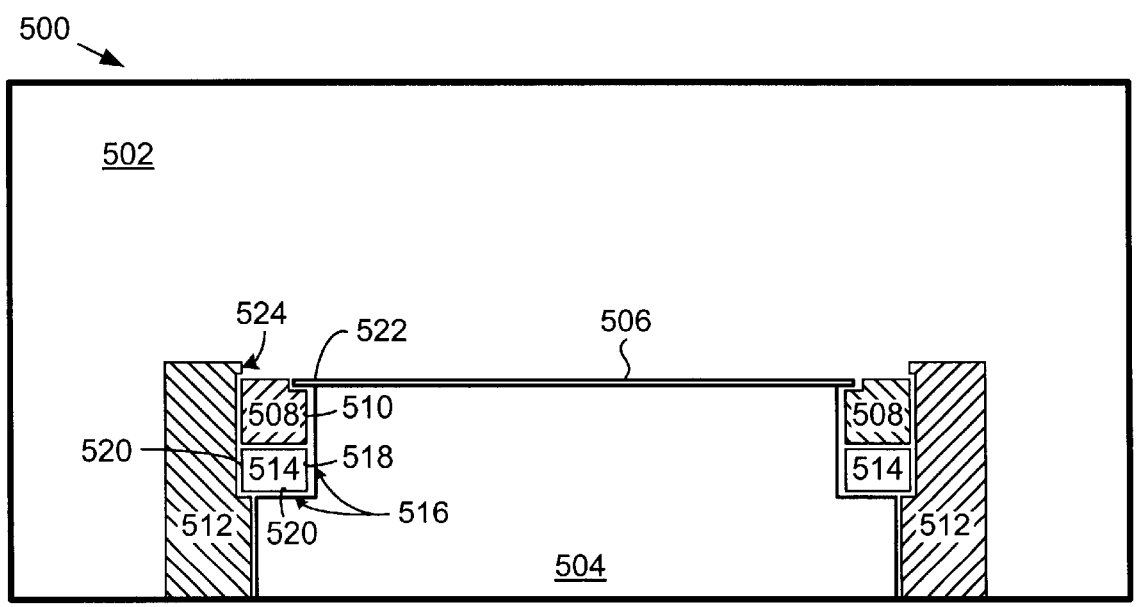
FIG. 5 illustrates a plasma processing apparatus 500 including a RF coupler, an inner RF coupled edge ring and an outer edge ring, in accordance to another embodiment of the third aspect of the invention.

FIG. 5 illustrates a plasma processing apparatus 500 according to another embodiment of the third aspect of the invention. The plasma processing apparatus 500 includes a wafer processing chamber 502 having an electrostatic chuck (ESC) 504. The chuck 504 acts as an electrode and supports a wafer 506 (i.e., substrate) during fabrication. An inner RF coupled edge ring 508 borders an edge 510 of the chuck 504 and provides a RF coupled region the extends beyond the edges of the wafer 506. An outer edge ring 512 borders the inner RF coupled edge ring 508 and an outer edge of the chuck 404. As shown in FIG. 5, the outer edge ring 512 also borders a RF coupler 514.

A top surface of the RF coupler 514 is positioned directly below a bottom surface of the inner RF coupler ring 508. The inner RF coupled edge ring 508 shields the RF coupler 514 from the etching process (i.e., ion bombardment). The inner RF coupled edge ring 508 and the RF coupler 514 are used to shield a notch 516 of the chuck 404 from ion bombardment.

As shown in FIG. 5, RF coupler 514 is positioned so that the notch 516 of the chuck 504 is adjacent an inner surface 518 and a bottom surface 520 of the RF coupler 514. The inner surface 518 is also within the outer edge of the wafer 406. Similar to inner RF coupled edge ring 508, an outer surface 522 of the RF coupler 514 extends beyond the outer edge of the wafer 406 and beyond an outer edge 522 of the chuck 404.

The RF coupler 514 is made of material with suitable properties so that a portion of the RF energy provided to the chuck 504 is RF coupled to the inner RF coupled edge ring 508. RF coupler 514 can be made from a variety of materials. Examples of suitable materials include conductive materials (e.g., metals), semiconducting materials (e.g., Silicon Carbide) or dielectric materials, wherein the conductivity of the material can be controlled through doping and the like. Advantageously, RF coupler 514 offers more flexibility for tailoring the amount of RF coupled energy that extends beyond the edges of wafer 506. This can be achieved by selecting the material for the RF coupler 514 in relation to the selected material for the chuck 504 and the inner RF coupled edge ring 508.

In addition, given that RF coupler 514 is shielded from the ion bombardment, if desired, RF coupler 514 can be made of high conducting material to increase the amount of RF energy that is coupled. In one embodiment, RF coupler can be made of high conducting material (e.g. Aluminum) that is surrounded by a coating (or layer) of dielectric material (e.g. Anodized Aluminum). Hence, RF coupling can be improved by either using a thinner layer of coating that or increasing the conductivity of the material used as the RF coupler 514.

Furthermore, as shown in FIG. 5, the outer edge ring 512 has an overlap portion 524 that extends above the top surface of the inner RF coupled edge ring 508. The overlap portion 524 shields any open seams that may be present. This results in providing better protection for the outer surface of the chuck 404 as well as outer surface 522 of the RF coupler 514.

As discussed earlier, the application of RF power to the chuck 506 results in the formation of an electric field and in turn a sheath above the wafer 506. The electric field associated with the sheath promotes the acceleration of ions toward the top surface of the wafer. Advantageously, the inner RF coupled edge ring 508 provides a RF coupled region that extends beyond the edge of wafer 506 such that the resulting sheath has a substantially uniform thickness over the entire surface of the wafer 506, including over the edge of the wafer 506. By providing an extended RF coupled region, the RF coupled edge ring 508 performs a corrective action on the sheath above the wafer 506. Specifically, in one embodiment, the thickness (or density) of the sheath near the perimeter (edges) of the wafer becomes substantially the same as the thickness (density) of the sheath directly above the chuck. As discussed earlier the resulting thickness (density) of the sheath substantially improves uniformity of the sheath across the wafer 506. Hence, in comparison to the sheath 112 of FIG. 1A, the sheath above wafer 506 is substantially improved.

As a result of the uniform thickness (density) of the sheath above wafer 406, the collision rate of ions with the surface of the wafer 506 is substantially more uniform across the entire surface of the wafer 506 than obtained by conventional approaches. Furthermore, the angle at which the ions collide with the surface of the wafer 506 is substantially normal not only at inner regions but also peripheral regions of the wafer 506. Consequently, the etch rate across the entire surface of the wafer 506 is more uniform than conventionally achieved and etched features at the peripheral regions do not suffer from "tilting" problems.

Figure 6:
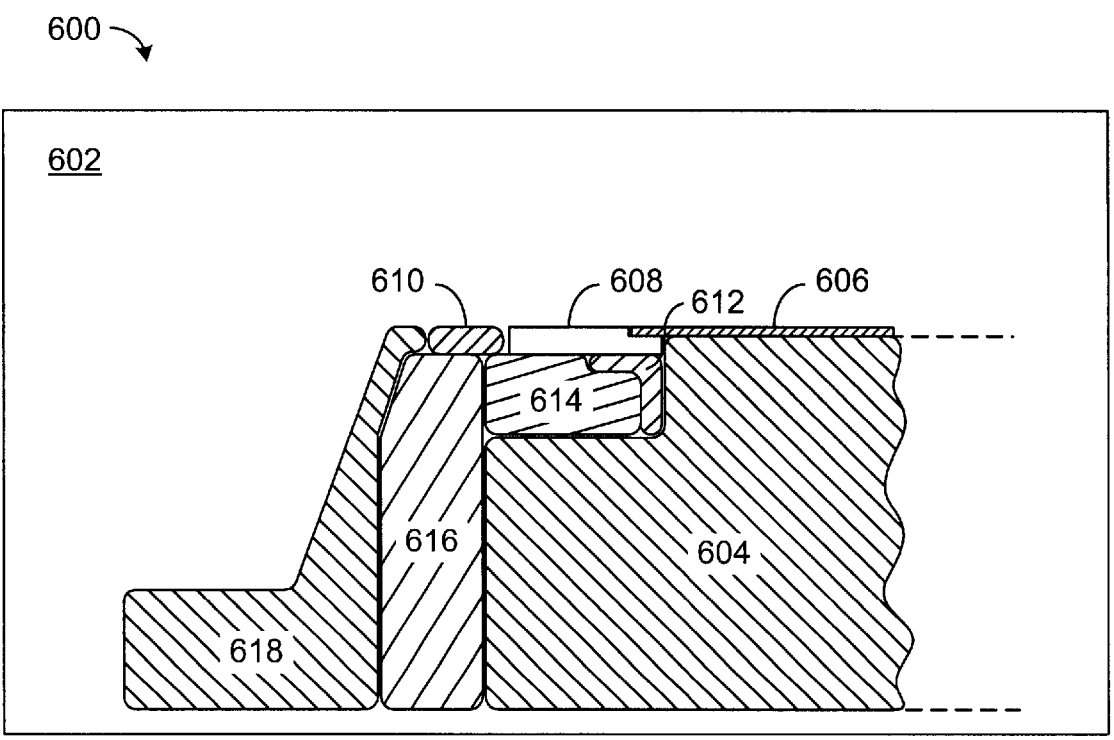
FIG. 6 illustrates a portion of a cross section of a plasma processing apparatus 600 including dielectric fillers, in accordance to yet another embodiment of the third aspect of the invention.

FIG. 6 illustrates a portion of plasma processing apparatus 600 according to yet another embodiment of the third aspect of the invention. The plasma processing apparatus 600 includes a wafer processing chamber 602 having an electrostatic chuck (ESC) 604 (only one side of a cross section is shown). The chuck 504 acts as an electrode and supports a wafer 604 (i.e., substrate) during fabrication. An inner RF coupled edge ring 608 borders the edge of the chuck 604 and provides a RF coupled region the extends beyond the edge of the wafer 606. An outer edge ring 610 borders the edges of the inner RF coupled edge ring 608. An RF coupler 612 is positioned below the inner RF coupled edge ring 608 and borders an edge of the chuck 604. A dielectric filler 614 is positioned under the inner RF coupled edge ring 608 and borders the RF coupler 612. A bottom surface of the dielectric filler 614 is adjacent to an upper edge of the chuck 604.

Advantageously, dielectric filler 614 can provide even more flexibility in focusing the amount of RF electric energy that is RF coupled. The dielectric filler 614 can minimize any coupling with respect to the outer edge ring 610. For example, dielectric filler 614 can be made of appropriate insulator material such as, Ceramic, Quartz, Teflon, and Polymer. The amount of insulation can also be controlled by choosing the thickness of the selected material for the dielectric filler 614.

A dielectric filler 616 is positioned below outer edge ring 610. The dielectric filler 616 borders an outer edge of the chuck 106. Advantageously, dielectric filler 616 is positioned to isolate the RF powered chuck 604 from a grounded region of an outer ground ring 618. Typically, the outer ground ring 618 is positioned in the vicinity of a wall of the wafer processing system 602.

As discussed with respect to FIGS. 4 and 5, by providing an extended RF coupled region that extends beyond the edges of wafer 604, a corrective action is performed on the sheath above the wafer 604. Consequently, the etch rate across the entire surface of the wafer 606 is more uniform than conventionally achieved and etched features at the peripheral regions do not suffer from "tilting" problems. In addition, by overlapping the gaps that may be present in the system, dielectric fillers 614 and 616 can provide even better protection for the chuck 604.

The various edge rings discussed above can be made using material that is relatively inexpensive and easy to manufacture and/or replace. This material can be chosen from a variety of material that are compatible to a particular etching process The invention has numerous advantages. One advantage of the invention is that etch rate uniformity across a substrate surface is significantly improved. Another advantage of the invention is that significant improvement in etch rate uniformity is achieved without risking contamination of the processing chamber. Yet another advantage is that tilting of etched features can be substantially eliminated.

Although only a few embodiments of the present invention have been described in detail, it should be understood that the present invention may be embodied in many other specific forms without departing from the spirit or scope of the invention. Therefore, the present examples are to be considered as illustrative and not restrictive, and the invention is not to be limited to the details given herein, but may be modified within the scope of the appended claims.

What is claimed is:

1. A plasma processing chamber for etching a substrate, said plasma processing chamber comprising:
   a substrate having a top surface, a bottom surface and an edge;
   a radio frequency (RF) powered chuck, said RF powered chuck supporting at least a portion of the bottom surface of the substrate; and
   an inner RF coupled edge ring placed over a portion of said RF powered chuck and adjacent to an edge of the substrate,
   wherein a portion of RF energy provided by said RF powered chuck is coupled to said inner RF coupled edge ring;
   a RF coupler provided between said inner RF coupled edge ring and the portion of said RF powered chuck,
   wherein a portion of RF energy provided by said RF powered chuck is coupled to said inner RF coupled edge ring through said RF coupler.

2. The plasma processing chamber of claim 1, wherein said inner RF coupled edge ring surrounds the substrate.

3. The plasma processing chamber of claim 1, wherein the substrate is a wafer.

4. The plasma processing chamber of claim 1, said inner RF coupled edge ring consists essentially of a semiconductor material.

5. The plasma processing chamber of claim 1, said inner RF coupled edge ring consists essentially of silicon carbide.

6. The plasma processing chamber of claim 1, wherein said plasma processing chamber further comprises:
   an outer edge ring that surrounds said inner RF coupled edge ring.

7. The plasma processing chamber of claim 6, wherein said outer edge ring further surrounds a portion of said RF powered chuck.

8. The plasma processing chamber of claim 1, wherein said inner RF coupled edge ring and said RF coupler extend a predetermined distance from the edge of the substrate.

9. The plasma processing chamber of claim 1, wherein said plasma processing chamber further comprises:
   an outer edge ring that surrounds said inner RF coupled edge ring.

10. The plasma processing chamber of claim 9, wherein said inner RF coupled edge ring surrounds the substrate.

11. The plasma processing chamber of claim 9, wherein the substrate is a wafer.

12. The plasma processing chamber of claim 9, said inner RF coupled edge ring consists essentially of a semiconductor material.

13. The plasma processing chamber of claim 12, wherein said outer edge ring further surrounds a portion of said RF powered chuck.

14. The plasma processing chamber of claim 1, wherein said plasma processing chamber further comprising:
   a dielectric filler that surrounds a portion of said RF powered chuck.

15. The plasma processing chamber of claim 14, wherein the dielectric filler consists essentially of at least one of ceramic, quartz, polymer, and Teflon.

16. The plasma processing chamber of claim 14, said plasma processing chamber further comprising:
   a ground ring that surrounds said dielectric filler.

17. The plasma processing chamber of claim 1, wherein said RF coupler is a metal with a dielectric coating.

18. The plasma processing chamber of claim 17, wherein an amount of RF energy through said RF coupler from said RF power chuck to said inner RF coupled edge ring is directly proportional to the thickness of the dielectric coating.

19. A plasma processing chamber for etching a substrate, the substrate having a top surface, a bottom surface and an edge, said plasma processing chamber comprising:
   a radio frequency (RF) powered chuck, said RF powered chuck supporting at least a portion of the bottom surface of the substrate; and
   an elevated edge ring having an inner surface and an upper surface, the inner surface is placed over a portion of said RF powered chuck and adjacent to an edge of the substrate, the upper surface having a predetermined elevated distance from the top surface of the substrate,
   a RF coupler provided between said elevated edge ring and a portion of said RF powered chuck,
   wherein a portion of RF energy provided by said RF powered chuck is coupled to said elevated edge ring through said RF coupler.

20. The plasma processing chamber of claim 19, wherein the elevated edge ring surrounds the substrate.

21. The plasma processing chamber of claim 19, wherein the substrate is a wafer.

22. The plasma processing chamber of claim 19, wherein the elevated edge consists essentially of dielectric material.

23. The plasma processing chamber of claim 19, wherein the predetermined elevated distance is between 1 to 10 millimeters.

24. A plasma processing chamber for etching a substrate, the substrate having a top surface, a bottom surface and an edge, said plasma processing chamber comprising:
   a radio frequency (RF) powered chuck, said RF powered chuck supporting at least a portion of the bottom surface of the substrate; and
   a grooved edge ring having an inner surface that is placed over a portion of said RF powered chuck and adjacent to an edge of the substrate, and
   wherein the grooved edge ring provides a grooved area in the vicinity of the edge of the substrate.

25. The plasma processing chamber of claim 24, wherein the grooved area of the grooved edge ring surrounds the substrate.

26. The plasma processing chamber of claim 24, wherein the substrate is a wafer.

27. The plasma processing chamber of claim 24, wherein the grooved edge consists essentially of dielectric material.

28. The plasma processing chamber of claim 24, wherein a bottom surface of the grooved area is a predetermined distance below the bottom surface of the substrate.

29. The plasma processing chamber of claim 24, wherein the grooved area is defined by a first sloping surface and a second partially covered sloping surface that is partially covered by the bottom surface of the substrate, the first sloping surface connecting the upper surface with the partially covered sloping surface.

* * * * *